(12) United States Patent
Ma et al.

(10) Patent No.: US 9,246,036 B2
(45) Date of Patent: Jan. 26, 2016

(54) THIN FILM DEPOSITION (75) Inventors: Ruiqing Ma, Morristown, NJ (US);
Chuanjun Xia, Lawrenceville, NJ (US);
Prashant Mandlik, Lawrenceville, NJ (US)

(73) Assignee: UNIVERSAL DISPLAY CORPORATION, Ewing, NJ (US)

(*) Notice: Subject to any disclaimer, the term of this patent is extended or adjusted under 35 U.S.C. 154(b) by 366 days.

(21) Appl. No.: 13/589,622

(22) Filed: Aug. 20, 2012

(65) Prior Publication Data

US 2014/0049923 A1 Feb. 20, 2014

(51) Int. Cl.
| | | |
|---|---|---|
| H01L 33/52 | (2010.01) | |
| H01L 31/18 | (2006.01) | |
| H05K 7/00 | (2006.01) | |
| B05D 5/00 | (2006.01) | |
| B05D 1/00 | (2006.01) | |
| B05C 11/00 | (2006.01) | |
| H01L 21/56 | (2006.01) | |
| B05D 3/00 | (2006.01) | |
| H01L 31/048 | (2014.01) | |
| H01L 51/00 | (2006.01) | |

(52) U.S. Cl.
CPC ........... *H01L 31/048* (2013.01); *H01L 51/0005* (2013.01); *H01L 2251/568* (2013.01); *H01L 2933/0025* (2013.01); *Y02E 10/50* (2013.01)

(58) Field of Classification Search
USPC ........................................... 174/506
See application file for complete search history.

(56) References Cited

U.S. PATENT DOCUMENTS

| | | | |
|---|---|---|---|
| 4,540,618 A | * | 9/1985 | Suzuki et al. ............ 428/141 |
| 4,769,292 A | | 9/1988 | Tang et al. |
| 5,247,190 A | | 9/1993 | Friend et al. |
| 5,703,436 A | | 12/1997 | Forrest et al. |
| 5,707,745 A | | 1/1998 | Forrest et al. |
| 5,834,893 A | | 11/1998 | Bulovic et al. |
| 5,844,363 A | | 12/1998 | Gu et al. |
| 6,013,982 A | | 1/2000 | Thompson et al. |
| 6,087,196 A | | 7/2000 | Sturm et al. |
| 6,091,195 A | | 7/2000 | Forrest et al. |
| 6,097,147 A | | 8/2000 | Baldo et al. |
| 6,294,398 B1 | | 9/2001 | Kim et al. |
| 6,303,238 B1 | | 10/2001 | Thompson et al. |
| 6,337,102 B1 | | 1/2002 | Forrest et al. |
| 6,468,819 B1 | | 10/2002 | Kim et al. |

(Continued)

FOREIGN PATENT DOCUMENTS

| | | | | |
|---|---|---|---|---|
| JP | 07066131 | * | 3/1995 | ............ H01L 21/205 |
| WO | 2008057394 | | 5/2008 | |

(Continued)

OTHER PUBLICATIONS

Baldo, et al., "Highly Efficient Phosphorescent Emission fromOrganic Electroluminescent Devices," Nature, Sep. 10, 1998, 4 pp., Macmillan Publishers Ltd., London, UK.

(Continued)

*Primary Examiner* — Timothy Thompson
*Assistant Examiner* — Charles Pizzuto
(74) *Attorney, Agent, or Firm* — Morris & Kamlay LLP (57) ABSTRACT

A method of preparing a surface for deposition of a thin film thereon, wherein the surface including a plurality of protrusions extending therefrom and having shadowed regions, includes locally treating at least one of the protrusions.

32 Claims, 6 Drawing Sheets

(56) References Cited

U.S. PATENT DOCUMENTS

| | | |
|---|---|---|
| 6,548,912 B1 * | 4/2003 | Graff et al. .............. 257/787 |
| 7,279,704 B2 | 10/2007 | Walters et al. |
| 7,431,968 B1 | 10/2008 | Stein et al. |
| 7,645,177 B2 * | 1/2010 | Kwasny ...................... 445/24 |
| 7,968,146 B2 * | 6/2011 | Wagner et al. .......... 427/248.1 |
| 8,017,861 B2 * | 9/2011 | Basol ........................ 136/256 |
| 2003/0230980 A1 | 12/2003 | Forrest et al. |
| 2004/0174116 A1 | 9/2004 | Lu et al. |
| 2004/0231781 A1 * | 11/2004 | Bao et al. ................. 156/230 |
| 2008/0067929 A1 * | 3/2008 | Kuo ........................... 313/506 |
| 2008/0102223 A1 | 5/2008 | Wagner et al. |
| 2009/0203165 A1 * | 8/2009 | Pinarbasi et al. ............ 438/95 |
| 2010/0209652 A1 * | 8/2010 | Yoshizawa et al. .......... 428/63 |
| 2011/0114931 A1 * | 5/2011 | Lee et al. .................... 257/40 |

FOREIGN PATENT DOCUMENTS

| | | |
|---|---|---|
| WO | 2008057394 A1 | 5/2008 |
| WO | 2010011390 | 1/2010 |
| WO | 2010011390 A1 | 1/2010 |

OTHER PUBLICATIONS

Baldo, et al., "Very high-efficiency green organic light-emitting devices based on electrophosphorescence," Applied Physics Letters, Jul. 5, 1999, 4 pp., vol. 75, No. 1, American Institute of Physics, Melville, NY, USA.

Vogler, Marko, et al., Development of a novel, low-viscosity UV-curable polymer system for UV-nanoimprint lithography, Science Direct, Microelectronic Engineering 84, Feb. 12, 2007, pp. 984-988, Elsevier B.V., Amsterdam, The Netherlands.

Kang, Daeshik, et al., "Shape-Controllable Microlens Arrays via Direct Transfer of Photocurable Polymer Droplets", Advanced Materials, 2012, 24, pp. 1709-1715, Wiley-VCH Verlag GmbH & Co., Berlin, Germany.

\* cited by examiner

Figure 2

PRIOR ART

THIN FILM DEPOSITION

This invention was made with government support under Contract No. IIP-0948093 awarded by the National Science Foundation. The government has certain rights in the invention.

The claimed invention was made by, on behalf of, and/or in connection with one or more of the following parties to a joint university corporation research agreement: Reagents of the University of Michigan, Princeton University, the University of southern California, and the Universal Display Corporation. The agreement was in effect on and before the date the claimed invention was made, and the claimed invention was made as a result of activities undertaken within the scope of the agreement.

FIELD

In a number of embodiments, devices, systems and methods hereof relate to organic electronic devices that are protected from environmental elements such as moisture and oxygen.

BACKGROUND

The following information is provided to assist the reader in understanding technologies disclosed below and the environment in which such technologies may typically be used. The terms used herein are not intended to be limited to any particular narrow interpretation unless clearly stated otherwise in this document. References set forth herein may facilitate understanding the technologies or the background thereof. The disclosure of all references cited herein are incorporated by reference.

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted $Ir(ppy)_3$, which has the following structure:

In this structure, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

More details on OLEDs, and the definitions described above, can be found in U.S. Pat. No. 7,279,704, which is incorporated herein by reference in its entirety.

It is difficult for currently available thin film deposition or encapsulation technologies to cover large size particles on OLEDs and other systems. The general trend is that larger particles require thicker films to provide coverage, which results in longer process time and increased cost.

OLEDs and other electronic/microelectronic devices including water vapor sensitive cathodes and organic materials degrade upon storage. The degradation is evidenced by formation of dark spots, which may be caused by the ingress of water vapor and oxygen vertically through the bulk of the thin film encapsulation (TFE) or through surface protrusion defects (particles) embedded in the TFE, or by the ingress of water vapor and oxygen horizontally through the edge of the TFE. In most cases, the dominant degradation mechanism is ingression of water vapor and oxygen through surface protrusions or particles.

Figure 1:
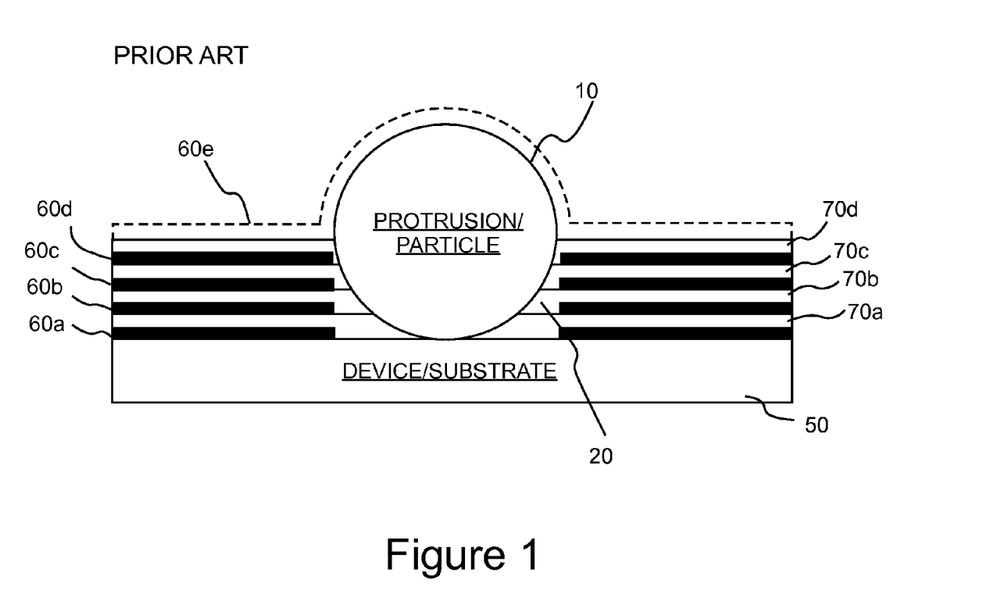
FIG. 1 illustrates a known process for covering protrusions in a thin film deposition technique or approach.

One of the most studied thin film encapsulation technologies is a multilayer approach described, for example, in U.S. Pat. No. 6,548,912. The multilayer barrier of that approach includes alternate layers of inorganic and polymer films. A pair of inorganic and polymer layers is called a dyad. The multilayer approach works on the principle of delaying the permeant molecules from reaching the device by forming long and tortuous diffusion paths. The multilayer approach to protrusion/particles encapsulation provides redundancy in the number of dyads. When the particle size is large, the required number of dyads can be very large as illustrated in FIG. 1.

Figure 2:
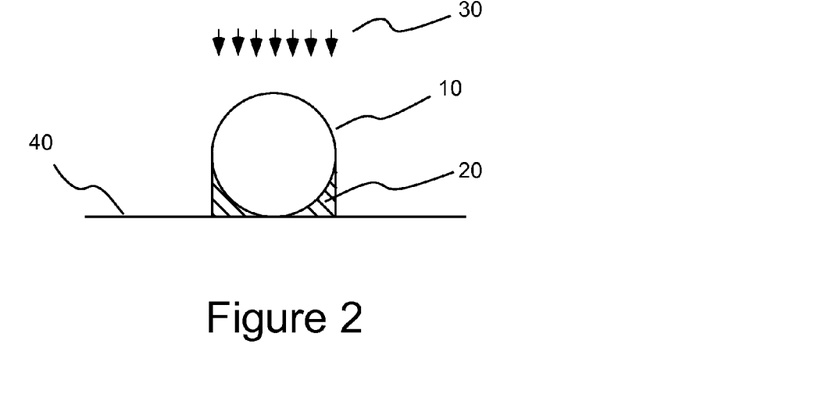
FIG. 2 illustrates a protrusion having or defining a shadowed region.

A number of common thin film deposition techniques used, for example, with inorganic materials/films are known to be anisotropic, directional or directionally limited. It is thus very difficult for deposited inorganic films to cover shadowed region under a protrusion. With reference to FIG. 2, a protrusion 10 may be defined as an entity that has or creates a shadowed region 20. Shadowed region 20 may be defined with respect to a columnar source of light having substantially the same orientation as a directional deposition technique. In FIG. 1, light from such a columnar source of light is represented by arrows 30, radiating from above (in the orientation of FIG. 2) and orthogonal to a surface 40 upon which protrusion 10 is positioned. Shadowed region 20 corresponds to the volume under the perimeter of protrusion 10 and above surface 40. In FIG. 2, protrusion 10 is illustrated as a spherical particle, but protrusions can be of generally any shape (whether regular or irregular).

Referring again to FIG. 1, under the technique of U.S. Pat. No. 6,548,912, inorganic barrier layer 60a, 60b, 60c, and 60d are alternately deposited with polymer layer 70a, 70b 70c and 70d on a surface of a device/substrate 50 upon which a plurality of protrusion defects 10 (for example, particles) are present. Polymer layers 70a, 70b 70c and 70d fill the shadowed region 20. However, protrusion 10 is relatively large, and four dyads are required to fill shadowed region 20 in FIG. 2. A fifth inorganic layer 60e (illustrated in broken lines) will be able to provide continuous coverage along the surface around protrusion 10. Generally, the thin film layer stack must have at least half of the thickness of protrusion 10 to provide a good surface profile to support a continuous coating. Materials may be deposited on top of the protrusions (not shown in the figures).

Other approaches have been proposed to deposit thin film as, for example, encapsulation barriers for microelectronic devices. One example is atomic layer deposition (ALD). However, it is difficult to provide good coverage of protrusions with ALD. Also, when the protrusion can move (for example, in the case of particles), ALD has problems holding the protrusions in place.

U.S. Patent Application Publication No. 2008/0102223 discloses an encapsulation technique using a single layer barrier. Because the material is deposited in a plasma-enhanced chemical vapor deposition (PECVD) chamber, it is possible to achieve a good conformal coating to cover a protrusion. However, film thickness may need to be increased to adequately cover larger protrusion.

Increasing film thickness translates into longer deposition time, more material usage, and eventually higher cost. Furthermore, there is no guaranty that large protrusions can be fully covered even using thicker films.

BRIEF SUMMARY

In summary, one aspect provides a method of preparing a surface for deposition of a thin film thereon, wherein the surface including a plurality of protrusions extending therefrom and having shadowed regions. The method includes locally treating at least one of the protrusions. The local treatment of one or more protrusions may, for example, be used to reduce a thickness of the thin film required to encapsulate the surface (as compared to the thickness required to encapsulate the surface without local treatment of the at least one of the protrusions).

In a number of embodiments, the method may further include defining a threshold value for at least one measurable aspect of the protrusions to determine protrusions for which local treatment is to be effected and locally treating protrusions for which the measurable aspect exceeds the threshold value. The at least one measurable aspect may, for example, be a dimension of the protrusions, a projected area of the protrusions, or a volume of the protrusions. The method may further include scanning the surface to determine the location on the surface of protrusions for which the measurable aspect exceeds the threshold value. Desired topological features other than protrusions may, for example, be determined and excluded from analysis for local treatment. In a number of embodiments, the threshold value is determined at least in part on the basis of a total actual cycle time required to cover protrusions that do not exceed the threshold value in a thin film deposition process. A thin barrier layer may be applied prior to applying the material to the at least one protrusion to protect against damage.

The at least one protrusion may, for example, be a defect. The defect may, for example, include a particle on the surface. A plurality of the protrusions may be locally treated, resulting in treatment of less than 10% of an area of the surface. In a number of embodiments, a plurality of the protrusions may be locally treated, resulting in treatment of less than 1% of an area of the surface.

Locally treating the at least one protrusion may, for example, result in reduction of a volume associated with a shadowed region of the at least one protrusion. Locally treating may, for example, include removal of the at least one protrusion or reduction in size of the at least one protrusion.

In a number of embodiments, locally treating includes applying a material to the at least one protrusion to reduce the volume associated with the shadowed region of the at least one protrusion. The application of the material may, for example, result in a surface of the material extending beyond the perimeter of the protrusion. In a number of embodiments, application of the material results in a surface of the material having an average perimeter which increases in a downward direction.

In a number of embodiments, the material is flowable. The material may, for example, be a liquid. The material/liquid may, for example, include a precursor to a polymer, and the method may further includes polymerizing the precursor.

In a number of embodiments, the surface of the protrusion adjacent to the shadowed region has affinity for the material (for example, a liquid). For example, the surface of the protrusion adjacent to the shadowed region may be hydrophobic and the liquid may be non-polar, or the surface of the protrusion adjacent to the shadowed region may be hydrophilic and the liquid may be polar. The method may, for example, further include effecting at least one treatment whereby the surface of the protrusion adjacent to the shadowed region is caused to have affinity for the liquid greater than an affinity of the remainder of the surface of the protrusion for the liquid and greater than an affinity of the surface for the liquid. The material/liquid may, for example, include acrylate compounds or epoxy compounds.

The material may, for example, be applied by inkjet printing or drop coating to protrusions for which a measurable aspect exceeds a threshold value.

In a number of embodiments wherein the surface of the protrusion adjacent to the shadowed region is caused to have affinity for the liquid greater than an affinity of the remainder of the surface of the protrusion for the liquid and greater than an affinity of the surface for the liquid, the method further includes applying the liquid to at least a portion of the surface including a plurality of protrusions and removing a bulk of the liquid in a manner such that some of the liquid remains only in the vicinity of the surface of the protrusions adjacent to the shadowed region. A thin barrier layer may, for example, be applied to the surface prior to application of the liquid to protect against damage.

A barrier layer applied to protect against damage may, for example, include at least one of an inorganic material, an organic material, or a metallic material. An inorganic material may, for example, be an oxide, a nitride, or an oxynitride. An organic material may, for example, be an acrylate or a siloxane. The barrier layer may, for example, be deposited by chemical vapor deposition, sputtering, e-beam, atomic layer deposition, evaporation, or spin coating.

The surface may, for example, be a surface of a microelectronic device, and the thin film may be deposited to encapsulate the microelectronic device. The microelectronic device may, for example, include an integrated circuit, a charge coupled device, a light emitting diode, a light emitting polymer device, an organic light emitting device, a metal sensor pad, a micro-disk laser, an electrochromic device, a photochromic device, a display, an organic electronic device, a microelectromechanical system, a thin film transistor, or a solar cell. In a number of embodiments, the microelectronic device includes an organic device such as an organic light emitting diode.

In a number of embodiments, the microelectronic device is formed on at least one flexible substrate. In a number of embodiments, wherein the surface is flexible and the protrusion is a particle defect, application of a material as described above results in fixing of the position of the particle defect relative to the surface.

The thin films applied herein can include a plurality of layers. The thin film may, for example, include a layer of a first material and at least a second layer of a second material different from the first material. The thin film may, for example, include at least one of an inorganic material, an organic material, or a metallic material. An inorganic material may, for example, be an oxide, a nitride, or an oxynitride. An organic material may, for example, be an acrylate or a siloxane. The thin film may, for example, include a plurality of layers. In a number of embodiments, the thin film includes a layer of a first material and at least a second layer of a second material different from the first material.

In another aspect, a method of encapsulating a device including a plurality of protrusions extending therefrom includes locally treating at least one of the protrusions. As described above, local treatment of one or more protrusions may, for example, be used to reduce a thickness of a thin film required to encapsulate the device, and depositing the thin film to encapsulate the device after local treatment of the at least one protrusion. The method may, for example, further include defining a threshold value for at least one measurable aspect of the protrusions to determine protrusions for which local treatment is to be effected. As described above, the method may further include depositing a protective, thin barrier layer on the device prior to locally treating the at least one protrusion.

In another aspect, an encapsulated device includes a surface comprising a plurality of protrusions extending therefrom, and a thin film deposited to encapsulate the device, wherein at least one of the protrusions has undergone local treatment prior to deposition of the thin film. As described above, local treatment of one or more protrusions may, for example, be used to reduce a thickness of the thin film required to encapsulate the device. In a number of embodiments protrusions exceeding a threshold value for at least one measurable aspect of the protrusions have undergone local treatment to reduce the thickness of the thin film required to encapsulate the device.

In a further aspect, a microelectronic device includes a surface comprising a plurality of protrusions extending therefrom, and a thin film deposited to encapsulate the microelectronic device, wherein at least one of the protrusions has undergone local treatment prior to deposition of the thin film. Local treatment of one or more protrusions may, for example, be used to reduce a thickness of the thin film required to encapsulate the microelectronic device. In a number of embodiments, protrusions exceeding a threshold value for at least one measurable aspect of the protrusions have undergone local treatment to reduce the thickness of the thin film required to encapsulate the microelectronic device.

In still a further aspect, system for preparing a surface for deposition of a thin film thereon, wherein the surface includes a plurality of protrusions extending therefrom which have shadowed regions, includes at least one detecting device to locate protrusion satisfying a threshold value for at least one measurable aspect of the protrusions and at least one device to locally treat at least one of the protrusions for which the measurable aspect exceeds the threshold value.

The foregoing is a summary and thus may contain simplifications, generalizations, and omissions of detail; consequently, those skilled in the art will appreciate that the summary is illustrative only and is not intended to be in any way limiting.

For a better understanding of the embodiments, together with other and further features and advantages thereof, reference is made to the following description, taken in conjunction with the accompanying drawings. The scope of the claimed invention will be pointed out in the appended claims.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 3:
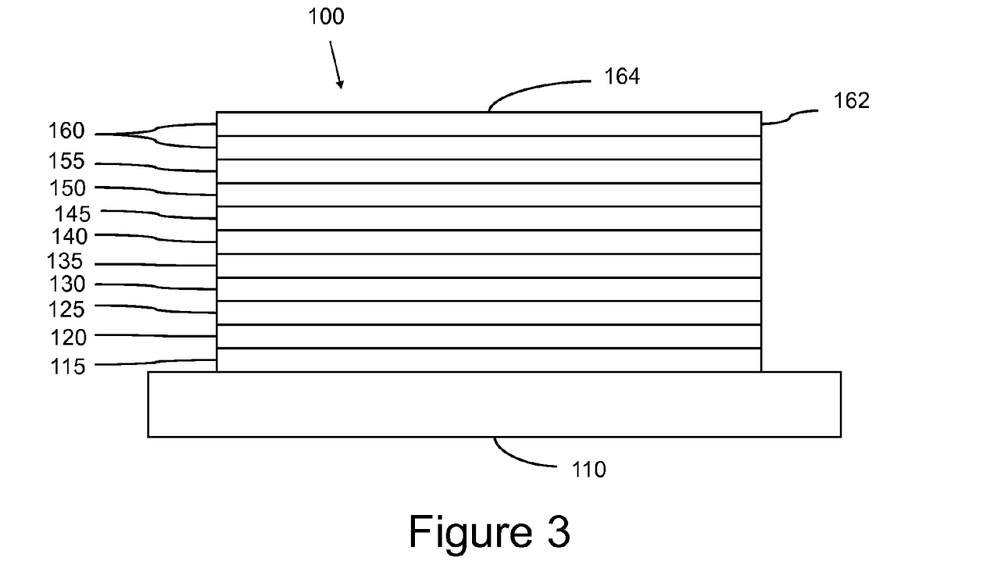
FIG. 3 illustrates an embodiment of organic light emitting device.

FIG. 3 illustrates an embodiment organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with F.sub.4-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 4:
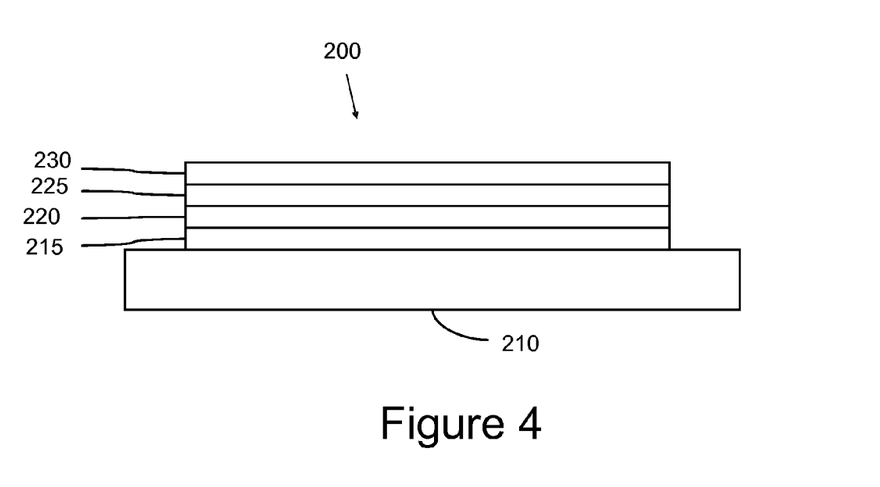
FIG. 4 illustrates an embodiment of an inverted organic light emitting device that does not have a separate electron transport layer.

FIG. 4 illustrates an embodiment of inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 4 provides one example of how some layers may be omitted from the structure of device 100.

The simple layered structure illustrated in FIGS. 3 and 4 is provided by way of non-limiting example, and it is understood that embodiments hereof may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although various layers may be described as including a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 3 and 4.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 3 and 4. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments hereof may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US 2007/023098 and PCT/US2009/042829, which are incorporated herein by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments hereof may be incorporated into a wide variety of consumer products, including flat panel displays, computer monitors, medical monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the methods hereof, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, arylkyl, heterocyclic group, aryl, aromatic group, and heteroaryl are known to the art, and are defined in U.S. Pat. No. 7,279,704 at cols. 31-32, which are incorporated herein by reference.

It will be readily understood that the components of the embodiments, as generally described and illustrated in the figures herein, may be arranged and designed in a wide variety of different configurations in addition to the described example embodiments. Thus, the following more detailed description of the example embodiments, as represented in the figures, is not intended to limit the scope of the embodiments, as claimed, but is merely representative of example embodiments.

Reference throughout this specification to "one embodiment" or "an embodiment" (or the like) means that a particular feature, structure, or characteristic described in connection with the embodiment is included in at least one embodiment. Thus, the appearance of the phrases "in one embodiment" or "in an embodiment" or the like in various places throughout this specification are not necessarily all referring to the same embodiment.

Furthermore, the described features, structures, or characteristics may be combined in any suitable manner in one or more embodiments. In the following description, numerous specific details are provided to give a thorough understanding of embodiments. One skilled in the relevant art will recognize, however, that the various embodiments can be practiced without one or more of the specific details, or with other methods, components, materials, et cetera. In other instances, well known structures, materials, or operations are not shown or described in detail to avoid obfuscation.

As used herein and in the appended claims, the singular forms "a," "an", and "the" include plural references unless the context clearly dictates otherwise. Thus, for example, reference to "a particle" includes a plurality of such particles and equivalents thereof known to those skilled in the art, and so forth, and reference to "the particle" is a reference to one or more such particles and equivalents thereof known to those skilled in the art, and so forth.

As described above, protrusions may be defined as entities having a shadowed region and include, for example, particles defects, device elements etc. Large protrusions may, for example, create a surface conformation that is difficult to cover/encapsulate in a thin film deposition technique. In general, protrusions have dimensions on the order of micrometers. Typically, there are only a limited number of large particles or particle defects on a surface. For example, typically there is a distribution of particles sizes on a surface and the largest particles have the least population. Devices, systems and methods hereof address the challenge of covering protrusions, including particles, using thin film deposition techniques with reduction of or elimination of the need to increase film thickness. In a number of embodiments in which a plurality of the protrusions are locally treated, such treatment results in treatment of less than 10%, or even less than 1%, of an area of the surface. That is, the total projected area (on the surface) of the treated protrusions is less than 10%, or even less than 1%, of the total area of the surface.

In a number of embodiments of methods hereof, known or standard thin film deposition techniques are used (for example, in encapsulation of microelectronic devices) to deposit a thin film on relatively small surface protrusions without other treatment of such relatively small protrusions. However, in such embodiments, larger protrusions are treated locally and/or selectively to reduce or eliminate the negative effect of such protrusions upon a thin film deposition technique (for example, directional thin film deposition techniques). In that regard, before deposition of a thin film to cover such larger particles, the large protrusions may be locally treated to provide a surface conformation which can be covered/encapsulated in a thin film deposition technique with a decreased film thickness as compared to the film thickness that would be required to encapsulate the surface without local treatment of the protrusions.

Figure 5:
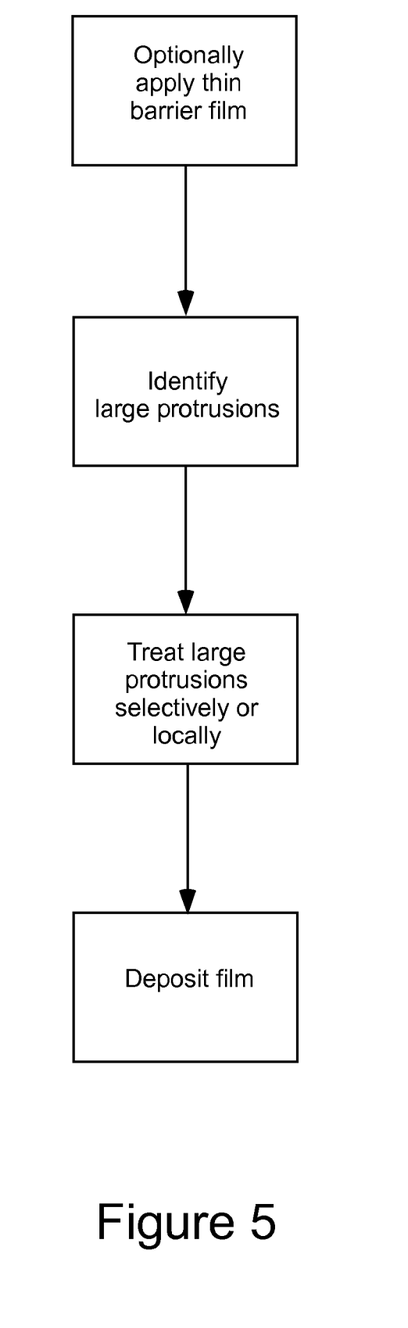
FIG. 5 illustrates a flow chart for an embodiment of a method hereof.

FIG. 5 illustrates a general methodology for a number of embodiments of methods hereof. In a number of representative embodiments of such methods described herein, protrusions arising from particle defects on a microelectronic device are locally treated. However, methods hereof are applicable generally to substrates for microelectronic devices and to any surface (whether regular or irregular) to which a thin film is to be applied.

Figure 6:
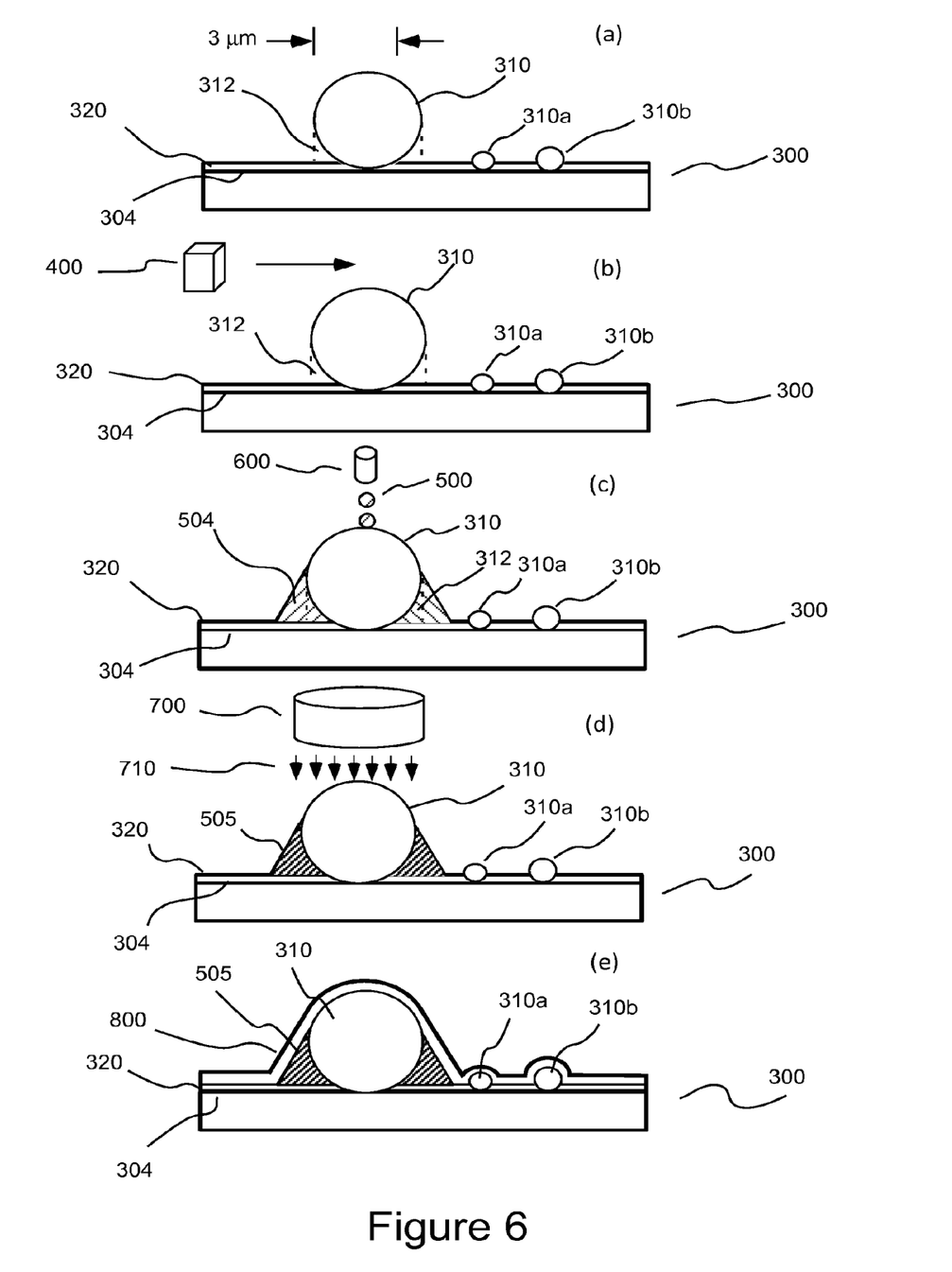
FIG. 6 illustrates actions or procedures (a) through (e) of an embodiment of method hereof for depositing a thin film on, for example, a microelectronic device.

In a number of embodiments hereof, a threshold value for at least one measurable aspect (for example, one or more dimensions or a value dependent thereon) of particles is defined to determine if local treatment of any of the particles is to be effected. Particles for which the measurable aspect exceeds the threshold value are then locally treated. In general, the local treatment reduces or eliminates the shadowed region associated with a particle or other protrusion. As used herein, the terms "local", "locally" and related terms when referring to treatment of a protrusion refer to treatment (for example, to reduce an associated shadow region) in the vicinity of the protrusion. In general, the surface outside the vicinity of the protrusion is not affected by the local treatment FIG. 6 illustrates various actions taken or procedures carried out in connection with a device 300 and the effects of such actions on device 300 and particles thereon in an embodiment of a method hereof. In the illustrated embodiment, a relatively large particle 310 and two smaller particles 310a and 310b on a surface 304 of device 300 are illustrated. Such particles may, for example, be particle defects introduced in a manufacturing process of device 300. Particle 310 has an associated shadowed region 312.

In a number of embodiments, a thin barrier layer 320 may first be deposited on surface 304 (using a thin film deposition technique) to protect any underlying layers that may be sensitive to procedures of the methods hereof as, for example, illustrated in procedure (a) of FIG. 6. A conformal coverage is preferred to ensure good coverage everywhere around the one or more particles or other protrusions on surface 304. Depositing initial barrier layer 320 is not required if processes/procedures of the methods hereof will not cause substantial harm to or substantially negatively affect any feature of device 300.

In a number of embodiments, particles requiring treatment under a method hereof are located via, for example, a scanning process. During the scanning process, particles may be mapped for the entirety of surface 304. For example, a laser scanning process may be performed using a scanner 400 as illustrated in procedure (b) of FIG. 6. A surface scanner 400 suitable for use herein is the YPI-500 particle scanner available from YGK Corporation of Yamanashi, Japan. For example, a light source (such as a laser) and an image capture device may be used to generate and capture an image of device 300. The image is analyzed via a computer and software executed thereby to, for example, output the size and location of particles on device 300. A dimension such as width of the particles and locations of the particles may be determined. Other information may also be collected. For example, such information may include height, depth, and/or composition of the particles. To exclude normal topological features on surface 304, a reference device (with no defects) may be used as a control. Alternatively, after scanning multiple devices, identified repeatable features may be used as a reference or control.

In a number of embodiments, a threshold size (which may, for example, be determined by a single dimension such a width) for protrusions/particles that require treatment is determined, for example, based on the typical distribution of particle size and overall consideration of TACT (total actual cycle time). For example, a particular process may take 5 minutes TACT and can cover protrusions/particles having a width under 3 μm well (that is, in accordance with identified specifications). In this example, the treatment of particles may be limited to those having a width of 3 μm or larger.

Procedures (c) and (d) of FIG. 6 illustrate a representative example of a localized treatment of particle 310 (which exceeds the threshold value of 3 μm in width in the above example). In the representative example, a precursor 500, in a flowable (for example, liquid) form, is applied to (for example, dropped on top of) particle 310. The location of particle 310 and the amount or volume of precursor 500 are determined in procedure (b). Particles 310 may, for example, be modeled as spheres to determine a volume of precursor 500 to be applied based, at least in part, on the volume of shadowed region 312 as determined from, for example, the width of the particle. The more information (for example, width, depth, height, etc.) known about an actual particle, however, the more accurately the volume of precursor 500 can be determined.

Precursor 500 may, for example, be applied by drop coating or inkjet/material printing via a device 600 (for example, an inkjet/material print head). Examples of deposition equipment suitable for drop-on-demand ink jetting printing include the DIMATIX® print systems and materials printers available from Fujifilm USA. A volume 504 of liquid precursor 500 is accumulated under a perimeter of particle 310 to at least partially fill or encompass shadowed region 312. In a number of embodiments, precursor 500 includes substantially no moisture, solvents or other components to cause significant (or any) damage to device 300. If the composition of the protrusions is determined, it may desirable to use different precursors 500 on different protrusions based on the composition, and thus properties the individual protrusions (for example, hydrophobicity, hydrophobicity, etc.).

To ensure precursor volume 504 will remain in and/or in the vicinity of shadowed region 312, some surface treatment may be desirable. In that regard, actions may be taken so that the surface of particle(s) 310 adjacent shadowed region 312 (or under/below the outer perimeter of particle 310) is caused to have an affinity for precursor 500 greater than the affinity of the remainder of the surface of particle(s) 510 for precursor 500 and greater than an affinity of surface 304 (or the surface of film 320, if present) for precursor 500. For example, in the case of a non-polar liquid precursor 500 (which exhibits an affinity for a hydrophobic surface for adhesion thereto) and a hydrophobic particle 310, a directional plasma treatment may be used to make all exposed surface areas (including, the exposed surfaces of surface 304/film 320 and the upper or top (that is, above the outer perimeter of particle 310) surface hydrophilic. After the above treatment, the surface of particle 310 in or adjacent shadowed region 312 remains hydrophobic. The relatively greater affinity of the surface of particle 310 adjacent shadowed region 312 for liquid precursor 500, assists in maintaining volume 504 of liquid precursor 500 in contact with the surface of particle 310 adjacent shadowed region 312.

In the case that liquid precursor 500 is non-polar and particle 310 is hydrophilic, an isotropic hydrophobic surface treatment can be used to make all the surfaces (including the surface of particle 310 in shadowed region 310) hydrophobic. The isotropic hydrophobic surface treatment may be followed by an anisotropic (directional) hydrophilic treatment, causing all surfaces other than the surface of particle 310 adjacent shadowed region 312 to be hydrophilic. The surface of particle 310 adjacent shadowed region 312 remains hydrophobic. The above procedures will ensure hydrophobic liquid precursor 500 properly wets and remains in the vicinity of shadowed region 312. Once again, the volume of liquid precursor 500 applied may be controlled, based, at least in part, on the size of particle 310 and the volume of shadowed region 312, to, for example, predictably reduce the volume of or fill/eliminate shadowed region 312.

As, for example, illustrated in procedure (d) of FIG. 6, in a number of embodiments, liquid precursor 500 may be cured or solidified into a solid volume 505 via a polymerization reaction upon application of, for example, UV energy represented by arrows 710 from a UV source 700. Other processes such as application of oxygen, heat, or moisture may be used to initiate polymerization. In a number of embodiments, liquid precursor 500 includes polymerizable or crosslinkable monomers, oligomers and/or prepolymers. After procedure (d), all shadowed regions 312 under large particles 310 (that is, particles 310 satisfying the threshold described above) will be eliminated or significantly reduced to, for example, enable all surface areas to be directly exposed to downward deposition of a thin film (for example, a barrier film). Another benefit of solidification of precursor liquid 500 is that loose particles 310 will be held in place by the solidified/polymeric materials 504a, substantially reducing or preventing the likelihood that such particles will cause damage to the deposited thin film at a later time (for example, under stresses of flexing)

As a result of procedure (d), a final thin film 800 may be deposited in procedure (e) of FIG. 6. Thin film 800 may provide good coverage of all protrusions/particles 310 as illustrated in FIG. 6. By locally or selectively treating relatively large particles 310, the thickness of film or layer 800 (or the combined thickness of film 320 and film 800) may be significantly less than thin films applied via currently used thin film deposition techniques when large particle defects are present. Locally or selectively treating relatively large protrusions effectively eliminates or substantially reduces the severity of overhangs or extending perimeters/edges which, for example, create shadowed regions, thereby facilitating surface coverage with significantly thinner films than possible under currently used thin film techniques in the presence of relatively large protrusions. The material of thin film 800 may be the same as or different from the material used for barrier layer or film 320. Moreover, as described above, when the procedures used to locally or selectively treat large protrusions hereof do not cause substantial damage to device 300, thin barrier film 320 need not be deposited.

Figure 7A:
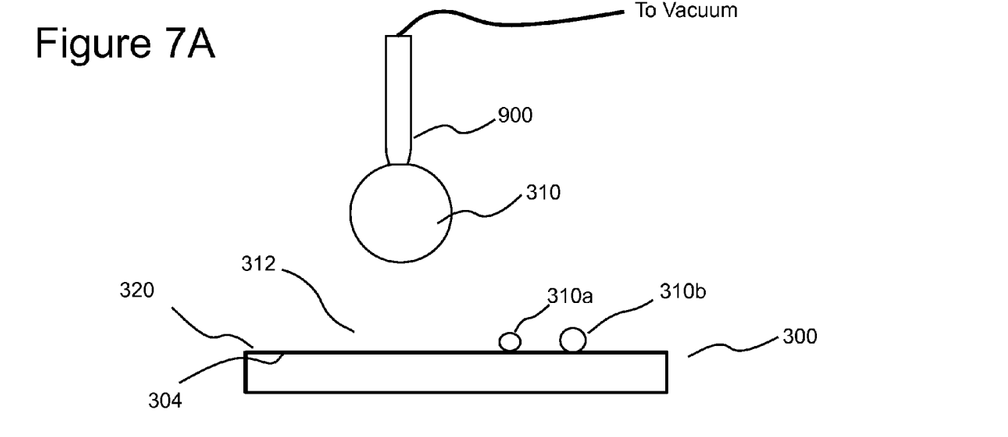
FIG. 7A illustrates removal of a particle and elimination of an associated shadowed region using a vacuum pick-up device or vacuum tip.

In a number of embodiments, more detailed information may, for example, be detected during the procedure for scanning a surface to, for example, identify and locate protrusions. If particles can be determined to be on the top of device 300 (or another surface), one or more particle(s) 310 may be removed via, for example, a small vacuum pick-up device or vacuum tip 900 (see FIG. 7A) brought into contact with particle 310. Particles (for example, particles satisfying a particular measurable threshold (which may be the same as or different from the dimensional threshold discussed above) may be removed or decreased in size via other techniques, including but not limited to, selectively etching (either fully or partially). Similar to applying a material to a particle as described above, locally or selectively treating particles by removal thereof or reducing the size thereof results in reduction or elimination of shadowed regions associated with the treated particles and obviates the need to grow thicker thin films. Removal and/or reduction in size of particles may, in certain embodiments, eliminate the need to apply a material to particles to reduce or eliminate shadowed regions as described above in connection with FIG. 6. Further, removal and/or reduction in size of particles may, in other embodiments, be used in connection with application of a material to particles to, for example, reduce or eliminate shadowed regions. For example, removal and/or reduction in size of particles may occur before or after procedures (a) or (b) described above in connection with FIG. 6.

Figure 7B:
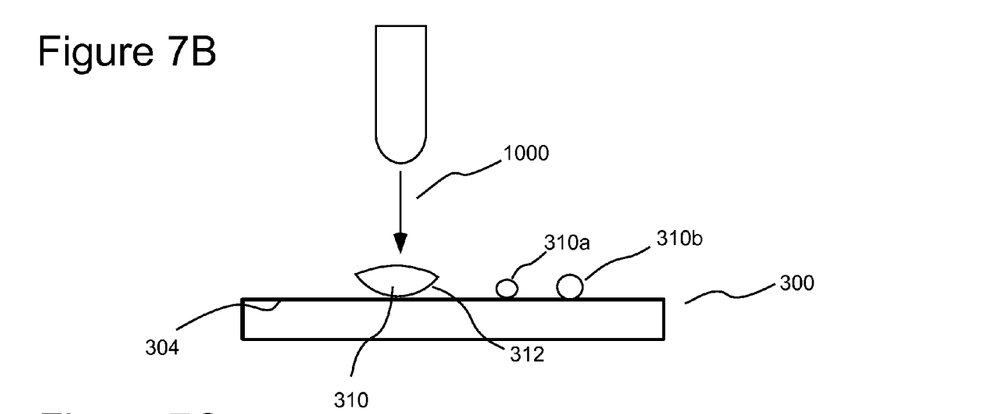
FIG. 7B illustrates reduction of the size of a particle and reduction of an associated shadowed region using a laser beam above the particle.
Figure 7C:
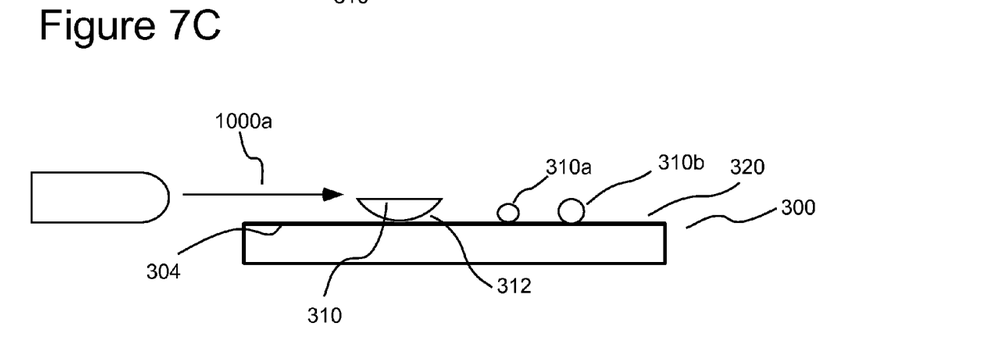
FIG. 7C illustrates reduction of the size of a particle and reduction of an associated shadowed region using a laser beam generally parallel to a surface of a microelectronic device.

Etching may, for example, be done by a localized laser beam 1000 as, for example, illustrated in FIG. 7B. As illustrated in FIG. 7C, if a laser beam 1000a can be set, for example, horizontal or otherwise generally parallel to a surface (for example, of surface 304 of a device 300) and can be suitably controlled, a scan to identify, for example, large particles may not be required. Such a horizontal etching may, for example, be performed at any time even before the growth of the first barrier film (taking care that a device or other surface does not become damaged) to etch the particles down to a specific size. Plasma etching may also be used. If a particle to be decreased in size or removed via etching is formed from a polymeric material, the particle can be etched by selecting an etching plasma which etches only polymers but not the material of, for example, barrier film 320 or surface 304 (if barrier film 320 is absent).

In a representative example of a method hereof, particle size is used in the decision making process. Size in this example refers to the largest dimension in a two-dimensional projection of the particle on the surface of, for example, a microelectronic device such as or including an integrated circuit, a charge coupled device, a light emitting diode, a light emitting polymer device, an organic light emitting device, a metal sensor pad, a micro-disk laser, an electrochromic device, a photochromic device, a display, an organic electronic device, a microelectromechanical system, a thin film transistor or a solar cell. Such microelectronic devices typically include multiple layers disposed upon a substrate. The surface may also be the surface of the substrate for a microelectronic device upon which such layers are later deposited. In a number of embodiments, the surface is a surface of an organic light emitting diode or a substrate therefor.

In a number of embodiments, the threshold dimension of protrusion size that is to be identified for local treatment is determined, at least in part, on the basis of TACT. For example, if the thin film encapsulation process being used can encapsulate particles up to 2 μm while meeting TACT requirements, the lower limit/threshold for particles that require treatment is set at 2 μm. After determination of the particle dimension threshold, a scan is performed to determine the dimension and location of all the particles that have a dimension larger than 2 μm using, for example, a YPI-500 surface particle scanner. Optionally, if one or more particles are detected to be on the very top layer of the device, a vacuum pick-up device or tip may be used to remove such particles.

As describe above, a thin film layer or barrier layer may be applied to protect the underlying device from potential damage. Many thin film encapsulation processes may be used in this procedure. An example, of such a thin film encapsulation method is described in U.S. Pat. No. 7,968,146. The barrier layer may be very thin, and is optional if the subsequent procedures will not cause substantial or excessive damage to the device. Examples of suitable materials for the barrier layer include, but are not limited to, inorganic materials, organic materials, and/or metallic materials.

After optional deposition of a barrier layer, local treatment of particles/protrusions may be performed via an ink-jet printing head brought into operative connection with each particles identified to have a dimension greater than the 2 μm threshold. Based on the particle size, a sufficient volume of a liquid precursor, which may include only monomers, oligomers, and/or prepolymers is, for example, dropped on the particles to suitably reduce the size of or fill the shadowed regions associated with the identified particles. Examples of suitable liquid precursor materials include acrylate or epoxy monomers, oligomers or prepolymers. The liquid precursor may, for example, be applied using ink jetprinting equipment as described above. The liquid precursor is, for example, polymerized using a UV light source or a thermal source to cure or crosslink the monomers, oligomers and/or prepolymers thereof. The resultant cured volume of material may, but need not, have an average perimeter which increases in a downward direction as illustrated, for example, in FIG. 6. Optimization of the volume of the liquid precursor or other shadow region filling material may be used to ensure adequate coverage using a particular thin film deposition technique. In a number of embodiments, it may be desirable to minimize the footprint the material reducing the size of the shadowed region and/or to minimize the time required to complete the subsequent thin film deposition process. Optimization criteria may differ for different applications, filling materials etc.

After curing of the liquid precursor, the thin film encapsulation process is then completed at the specified TACT. The thin firm deposition or encapsulation process described in U.S. Pat. No. 7,968,146 may, for example, be used. Likewise, the thin film deposition process described in U.S. Pat. No. 6,548,912 may be used. A plurality of thin layers of different composition may, for example, be applied or deposited to form a thin film. For example, multiple layers of alternate inorganic/organic films, alternate inorganic films of different type, alternate hybrid films, or alternate inorganic/organic/metallic films may deposited. The thin film deposition process of U.S. Patent Application Publication No. 2008/0102223 may also be used. In a number of embodiments, the encapsulating film thickness applied in the thin film deposition may, for example, be in the range or approximately 0.1 μm to 5 μm (not including the thickness of any barrier film 320, which may, for example, have a thickness in the range of approximately 0.01 μm to 1 μm).

Thin film deposition techniques are often, for example, used to deposit films having a thickness on the scale of nanometers to micrometers. A desirable film thickness may, for example, be in the range of approximately 0.1 μm to 5 μm. Typically the required total thickness for the thin film encapsulation is the thickness needed for encapsulating a perfect defect free surface plus the thickness needed to cover protrusions/particles. The film thickness typically required to cover protrusions is typically half of the height (size) of the largest protrusions. For example, in the case of a surface having protrusions with the size of 10 μm and a thin film capable of encapsulating a defect free surface with 1 μm thickness, the total thin film thickness required is 6 μm (10/2+1). With the local treatment of protrusion larger than 2 μm as described herein, the total thickness of the required film will be reduced to 2 μm (2/2+1), which is a 67% reduction of thin film thickness, and thus TACT.

Figure 8:
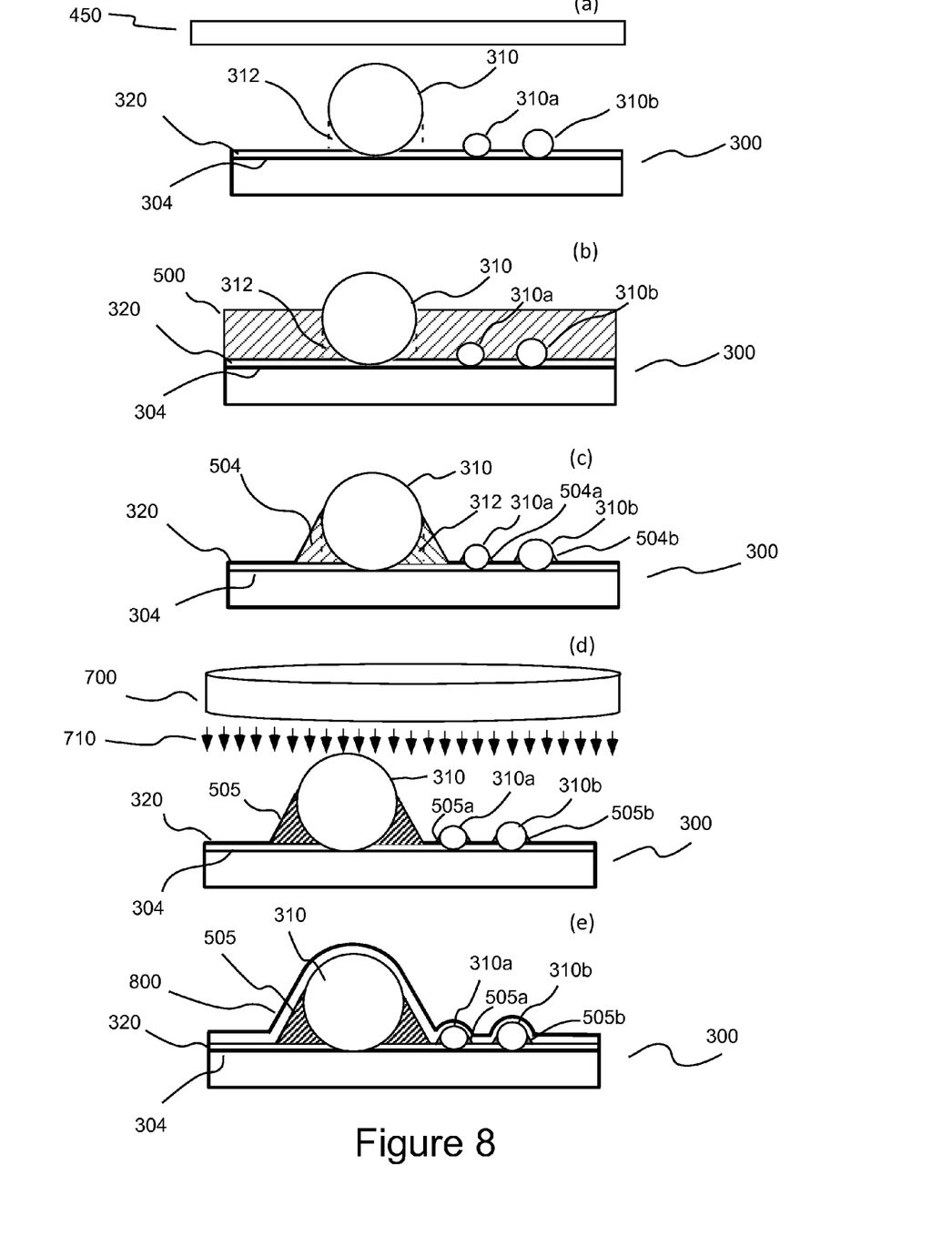
FIG. 8 illustrates actions or procedures (a) through (e) of another embodiment of method hereof for depositing a thin film on, for example, a microelectronic device.

In a number of embodiments hereof, protrusions may be locally treated without the need to identify protrusions satisfying a threshold value. FIG. 8 illustrates various actions taken or procedures carried out in connection with device 300 (as described above) and the effects of such actions on device 300 and protrusions/particles 310, 310*a* and 310*b* thereon in such an embodiment of a method hereof. As described above, a thin barrier layer 320 may optionally first be deposited on surface 304 to protect any underlying layers that may be sensitive to procedures of the methods hereof as, for example, illustrated in procedure (a) of FIG. 8. As described above, the surfaces bordering the shadowed region of all protrusion may be caused to have a unique, selective affinity for a flowable precursor. Procedures/devices 450 used in effecting such selective affinity are represented schematically in procedure (a) of FIG. 8. Once such selective affinity is achieved, flowable (for example, liquid) precursor 500 may be applied to the entire surface as illustrated in procedure (b) of FIG. 8. A sufficient volume of precursor 500 may, for example, be applied to ensure that precursor 500 fills the shadowed regions of all protrusions.

The bulk of precursor 500 may then be removed (for example, via a drying process, gravitational drainage etc.) as illustrated in procedure (c) of FIG. 8. Because of the affinity of surfaces of bordering the shadowed regions of all protrusion, a volume 504, 504*a* and 504*b* of precursor 500 will remain in the vicinity of the shadowed regions of each protrusion 310, 310*a* and 310*b* (in the illustrated example). Liquid precursor 500 may, for example, be applied in a spraying or sputtering process.

As, for example, illustrated in procedure (d) of FIG. 8, in a number of embodiments, liquid precursor 500 may be cured or solidified into a solid volumes 505, 505*a* and 505*b* via a polymerization reaction upon application of, for example, UV energy represented by arrows 710 from a UV source 700. Once again, other processes such as application of oxygen, heat, or moisture may be used to initiate polymerization. As a result of procedure (d), a final thin film 800 may be deposited in procedure (e) of FIG. 8.

This disclosure has been presented for purposes of illustration and description but is not intended to be exhaustive or limiting. Many modifications and variations will be apparent to those of ordinary skill in the art. The example embodiments were chosen and described in order to explain principles and practical application, and to enable others of ordinary skill in the art to understand the disclosure for various embodiments with various modifications as are suited to the particular use contemplated.

Thus, although illustrative example embodiments have been described herein with reference to the accompanying figures, it is to be understood that this description is not limiting and that various other changes and modifications may be affected therein by one skilled in the art without departing from the scope or spirit of the disclosure.

What is claimed is:

1. A method of preparing a surface for deposition of a thin film thereon, the surface including a plurality of protrusions extending therefrom and having shadowed regions, comprising:

defining a threshold value for at least one measurable aspect of the protrusions to determine protrusions for which local treatment is to be effected; and locally treating protrusions for which the measurable aspect exceeds the threshold value.

2. The method of claim 1 wherein the at least one measurable aspect is a dimension of the protrusions, a projected area of the protrusions, or a volume of the protrusions.

3. The method of claim 1 wherein locally treating comprises removal of the at least one protrusion or reduction in size of the at least one protrusion.

4. A method of preparing a surface for deposition of a thin film thereon, the surface including a plurality of protrusions extending therefrom and having shadowed regions, comprising:
locally treating at least one of the protrusions, wherein the at least one protrusion is a defect, wherein the defect comprises a particle on the surface.

5. A method of preparing a surface for deposition of a thin film thereon, the surface including a plurality of protrusions extending therefrom and having shadowed regions, comprising:
locally treating at least one of the protrusions, wherein a plurality of the protrusions are locally treated, resulting in treatment of less than 10% of an area of the surface.

6. The method of claim 5 wherein the plurality of the protrusions are locally treated, resulting in treatment of less than 1% of the area of the surface.

7. A method of preparing a surface for deposition of a thin film thereon, the surface including a plurality of protrusions extending therefrom and having shadowed regions, comprising:
locally treating at least one of the protrusions, wherein locally treating the at least one protrusion results in reduction of a volume associated with a shadowed region of the at least one protrusion, wherein locally treating comprises reducing a volume associated with a shadowed region of the at least one protrusion.

8. The method of claim 7 wherein locally treating comprises applying a material to the at least one protrusion to reduce the volume associated with the shadowed region of the at least one protrusion.

9. The method of claim 7 further comprising scanning the surface to determine a location on the surface for which a measurable aspect of the protrusions exceeds a threshold value.

10. The method of claim 7 wherein a threshold value is determined at least in part on a basis of a total actual cycle time required to cover protrusions that do not exceed the threshold value in a thin film deposition process.

11. The method of claim 8 wherein application of the material results in a surface of the material extending beyond the perimeter of the protrusion.

12. The method of claim 8 wherein the material is a liquid.

13. The method of claim 8 wherein the material is applied by inkjet printing or drop coating to protrusions for which a measurable aspect exceeds a threshold value.

14. The method of claim 8 further comprising applying a thin barrier layer prior to applying the material to the at least one protrusion to protect against damage.

15. The method of claim 8 wherein the surface is flexible and the protrusion is a particle defect, and wherein application of the material results in fixing of a position of the particle defect relative to the surface.

16. The method of claim 11 wherein the application of the material results in the surface of the material having an average perimeter which increases in a downward direction.

17. The method of claim 12 wherein the liquid comprises a precursor to a polymer.

18. The method of claim 12 further comprising effecting at least one treatment whereby a surface of the protrusion adjacent to the shadowed region is caused to have affinity for the liquid greater than an affinity of a remainder of the surface of the protrusion for the liquid and greater than an affinity of a surface for the liquid.

19. The method of claim 17 further comprising polymerizing the precursor.

20. The method of 17 wherein a surface of the protrusion adjacent to the shadowed region has affinity for the liquid.

21. The method of claim 17 wherein the liquid comprises acrylate compounds or epoxy compounds.

22. The method of claim 20 wherein the surface of the protrusion adjacent to the shadowed region is hydrophobic and the liquid is non-polar or the surface of the protrusion adjacent to the shadowed region is hydrophilic and the liquid is polar.

23. The method of claim 18 further comprising:
applying the liquid to at least a portion of the surface including the plurality of protrusions; and
removing a bulk of the liquid in a manner such that some of the liquid remains only in a vicinity of the surface of the protrusions adjacent to the shadowed region.

24. The method of claim 23 further comprising applying a thin barrier layer prior to applying the liquid to protect against damage.

25. The method of claim 9 wherein desired topological features other than protrusions are determined and excluded from analysis for local treatment.

26. The method of claim 14 wherein the thin barrier layer comprises at least one of an inorganic material, an organic material, or a metallic material.

27. The method of claim 14 wherein the thin barrier layer is deposited by chemical vapor deposition, sputtering, e-beam, atomic layer deposition, evaporation, or spin coating.

28. The method of claim 26 wherein the inorganic material is an oxide, a nitride, or an oxynitride.

29. The method of claim 26 wherein the organic material is an acrylate or a siloxane.

30. A method of preparing a surface for deposition of a thin film thereon, the surface including a plurality of protrusions extending therefrom and having shadowed regions, comprising:
locally treating at least one of the protrusions, wherein the surface is a surface of a microelectronic device and the thin film is to be deposited to encapsulate the microelectronic device, wherein the microelectronic device comprises an integrated circuit, a charge coupled device, a light emitting diode, a light emitting polymer device, an organic light emitting device, a metal sensor pad, a micro-disk laser, an electrochromic device, a photochromic device, a display, an organic electronic device, a microelectromechanical system, a thin film transistor, or a solar cell.

31. The method of claim 30 wherein the microelectronic device is formed on at least one flexible substrate.

32. The method of claim 30 wherein the microelectronic device comprises an organic light emitting diode.

\* \* \* \* \*